United States Patent
Fujii et al.

(10) Patent No.: US 7,439,649 B2
(45) Date of Patent: Oct. 21, 2008

(54) ACOUSTIC WAVE DEVICE AND METHOD OF MANUFACTURING ACOUSTIC WAVE DEVICE

(75) Inventors: Satoshi Fujii, Chino (JP); Takeo Funakawa, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/820,223

(22) Filed: Jun. 18, 2007

(65) Prior Publication Data

US 2007/0296304 A1    Dec. 27, 2007

(30) Foreign Application Priority Data

Jun. 22, 2006  (JP) .............................. 2006-172247
Jan. 16, 2007  (JP) .............................. 2007-007511

(51) Int. Cl.
H03H 9/25  (2006.01)

(52) U.S. Cl. .................................. 310/313 R

(58) Field of Classification Search ............ 310/313 R, 310/313 A, 313 B, 313 C, 313 D; 333/186, 333/193

See application file for complete search history.

(56) References Cited

U.S. PATENT DOCUMENTS

| | | | |
|---|---|---|---|
| 5,313,075 A | 5/1994 | Zhang et al. | |
| 5,446,329 A | 8/1995 | Nakahata et al. | |
| 5,523,240 A | 6/1996 | Zhang et al. | |
| 6,607,947 B1 | 8/2003 | Zhang et al. | |
| 7,355,202 B2 | 4/2008 | Zhang et al. | |
| 2003/0122453 A1* | 7/2003 | Yamada et al. | 310/363 |
| 2005/0202662 A1 | 9/2005 | Joshi et al. | |

FOREIGN PATENT DOCUMENTS

| | | |
|---|---|---|
| JP | 04-165679 | 6/1992 |
| JP | 04-177765 | 6/1992 |
| JP | 05-037284 | 2/1993 |
| JP | 6-164294 | 6/1994 |
| JP | 11-283976 | 10/1999 |
| JP | 2005-268798 | 9/2005 |

* cited by examiner

Primary Examiner—Thomas M Dougherty
(74) Attorney, Agent, or Firm—Harness, Dickey & Pierce, P.L.C.

(57) ABSTRACT

An acoustic wave device capable of exhibiting good characteristics for a prolonged period of time and a method of manufacturing an acoustic wave device are provided. An acoustic wave device of the invention includes a piezoelectric body layer having piezoelectricity and one surface, a pair of electrodes for, when electrified, inducing acoustic vibration in the piezoelectric body layer, the electrodes arranged on the one surface of the piezoelectric body layer, and a silicon dioxide layer provided in contact with the piezoelectric body layer and/or the electrodes, the silicon dioxide layer composed of silicon dioxide as its major component, wherein the silicon dioxide layer is formed by performing sputtering with a silicon dioxide target in an atmosphere of an oxygen flow rate ratio of 60% or more.

8 Claims, 9 Drawing Sheets

ACOUSTIC WAVE DEVICE AND METHOD OF MANUFACTURING ACOUSTIC WAVE DEVICE

CROSS-REFERENCE TO RELATED APPLICATION

This application claims priorities to Japanese Patent Applications No. 2006-172247 filed on Jun. 22, 2006 and No. 2007-007511 filed on Jan. 16, 2007 which are hereby expressly incorporated by reference herein in their entireties.

BACKGROUND

1. Technical Field

The present invention relates to an acoustic wave device and a method of manufacturing an acoustic wave device.

2. Related Art

An acoustic wave device that makes use of a propagation characteristic or a resonance characteristic of acoustic vibration of a surface acoustic wave (SAW) or a bulk acoustic wave (BAW) is known as an example of various devices such as a filter, an oscillator, a resonator and a convolver. Such an acoustic wave device includes a piezoelectric body and a pair of electrodes formed on the piezoelectric body for, when electrified, generating acoustic vibration in the piezoelectric body.

As an example of the acoustic wave device, there is known a device in which a silicon dioxide layer composed of silicon dioxide is formed to make contact with a piezoelectric body and/or electrodes for the purpose of temperature compensation, surface protection and so forth (see, e.g., JP-A-5-37284 and JP-A-6-164294).

For example, JP-A-5-37284 discloses an acoustic wave device in which a silicon dioxide layer, electrodes and a piezoelectric body are deposited one atop another on a hard layer formed of diamond or diamond-like layer. Furthermore, JP-A-6-164294 discloses an acoustic wave device in which a diamond-made hard layer, electrodes, a piezoelectric body layer and a silicon dioxide layer are deposited one atop another and an acoustic wave device in which a diamond-made hard layer, a piezoelectric body layer, electrodes and a silicon dioxide layer are deposited one atop another.

The silicon dioxide layer provided in such acoustic wave devices has an amorphous structure but it is known that the layer quality thereof varies largely with a manufacturing method, manufacturing conditions and the like (see, e.g., JP-A-2005-268798). As taught in JP-A-2005-268.798, examples of a typical method for forming the silicon dioxide layer include a sputtering method, a CVD method, a thermal oxidation method and a plasma oxidation method.

In the meantime, it is known that the characteristics of the acoustic wave devices noted above are affected by a constituent material of the devices. Particularly, in an acoustic wave device using a high frequency to deal with high-frequency signals, the constituent material thereof heavily affects the device characteristics.

SUMMARY

Accordingly, it is an object of the invention to provide an acoustic wave device capable of exhibiting good characteristics for a prolonged period of time and a method of manufacturing an acoustic wave device.

A first aspect of the invention is directed to an acoustic wave device. The acoustic wave device comprises a piezoelectric body layer having piezoelectricity and one surface, a pair of electrodes for, when electrified, inducing acoustic vibration in the piezoelectric body layer, the electrodes arranged on the one surface of the piezoelectric body layer, and a silicon dioxide layer provided in contact with the piezoelectric body layer and/or the electrodes, the silicon dioxide layer composed of silicon dioxide as its major component, wherein the silicon dioxide layer is formed by performing sputtering with a silicon dioxide target in an atmosphere of an oxygen flow rate ratio of 60% or more.

The present inventors have been made extensive researches and studies for a silicon dioxide layer. As a result, the present inventors found that, in an acoustic wave device having a structure in which a silicon dioxide layer makes contact with electrodes and/or a piezoelectric body, "the layer quality of the silicon dioxide layer heavily affects the characteristics of the acoustic wave device" and "there is a factor that the structural defects existing in the silicon dioxide layer may cause the variation of the silicon dioxide layer over time".

In the invention, the silicon dioxide layer is formed by sputtering using a silicon dioxide target in an atmosphere of an oxygen flow rate ratio of 60% or more. This makes it possible to reduce the number of ring-shaped structures having a three or more membered ring that are accompanied by structural defects in the amorphous structure of the silicon dioxide layer.

Thus, the silicon dioxide layer of the invention has a layer quality of reduced structural defects and therefore can improve the characteristics of the acoustic wave device. Furthermore, the silicon dioxide layer has a reduced number of the ring-shape structures, such as a three membered ring (threefold ring), which form a chemically unstable planar ring structure.

Therefore, the silicon dioxide layer of the invention exhibits good stability in layer quality and has an ability to keep the excellent characteristics of the acoustic wave device over a prolonged period of time.

In the above acoustic wave device, it is preferred that in a spectrum obtained by analyzing the silicon dioxide layer with a Raman spectroscopy, when the intensity of a peak existing in a wave number region of 800 to 850 $cm^{-1}$ is defined by Ps and the intensity of a peak existing in a wave number region of 475 to 515 $cm^{-1}$ is defined by P4, the peak intensity ratio P4/Ps is equal to or smaller than 1.2.

This makes it possible to improve the device characteristics of the acoustic wave device and the stability of the device characteristics.

Further, in the above acoustic wave device, it is also preferred that in a spectrum obtained by analyzing the silicon dioxide layer with a Raman spectroscopy, when the intensity of a peak existing in a wave number region of 800 to 850 $cm^{-1}$ is defined by Ps and the intensity of a peak existing in a wave number region of 600 to 620 $cm^{-1}$ is defined by P3, the peak intensity ratio P3/Ps is equal to or smaller than 1.0.

This also makes it possible to improve the device characteristics of the acoustic wave device and the stability of the device characteristics.

Furthermore, in the above acoustic wave device, it is also preferred that in a spectrum obtained by analyzing the silicon dioxide layer with a Raman spectroscopy, when the integral value of the intensity in a wave number region of 250 to 510 $cm^{-1}$ is defined by I1 and the integral value of the intensity in a wave number region of 800 to 840 $cm^{-1}$ is defined by I2, the intensity integral value ratio I1/I2 is equal to or smaller than 50.

This also makes it possible to improve the device characteristics of the acoustic wave device and the stability of the device characteristics.

Moreover, in the above acoustic wave device, it is also preferred that the constant term A of a Cauchy dispersion formula represented by the following equation (I) is 1.44 to 1.46:

$$n^2 = A + B/\lambda^2 \qquad (I)$$

where the λ is a wavelength of the light, the n is a refractive index of the silicon dioxide layer to the light having a wavelength of λ, and each of the A and B is a constant.

This also makes it possible to improve the device characteristics of the acoustic wave device and the stability of the device characteristics.

In the above acoustic wave device, it is preferred that each of the electrodes is a comb-shaped electrode, and when electrified, a surface acoustic wave is induced in the piezoelectric body layer as the acoustic vibration.

This makes it possible to provide a surface acoustic wave device having low insertion loss and excellent stability of an oscillatory frequency.

It is preferred that the above acoustic wave device further comprises a substrate for supporting the piezoelectric body layer.

Use of such a substrate makes it possible to provide an acoustic wave device having desired characteristics, while simplifying formation of the piezoelectric body layer.

In the above acoustic wave device, it is preferred that the piezoelectric body layer is provided on the substrate via a hard layer formed of diamond or diamond-like carbon.

By forming the hard layer with these materials, an acoustic velocity of the surface acoustic wave can be increased. As a result, it is possible to easily manufacture an acoustic wave device for high frequency.

A second aspect of the invention is also directed to a method of manufacturing an acoustic wave device. The method comprises the steps of preparing a substrate, providing a piezoelectric body layer composed of a piezoelectric material as its major component on the substrate, forming a pair of electrodes on the piezoelectric body layer, and forming a silicon dioxide layer composed of silicon dioxide as its major component so as to cover the electrodes, wherein in the silicon dioxide layer forming step, the silicon dioxide layer is formed by performing sputtering with a silicon dioxide target in an atmosphere of an oxygen flow rate ratio of 60% or more.

This makes it possible to manufacture an acoustic wave device having excellent device characteristics and the stability of the device characteristics.

A third aspect of the invention is also directed to a method of manufacturing an acoustic wave device. The method comprises the steps of preparing a substrate, providing a silicon dioxide layer composed of silicon dioxide as its major component on the substrate, forming a piezoelectric body layer composed of a piezoelectric material as its major component on the silicon dioxide layer, and forming a pair of electrodes on the piezoelectric body layer, wherein in the silicon dioxide layer providing step, the silicon dioxide layer is formed by performing sputtering with a silicon dioxide target in an atmosphere of an oxygen flow rate ratio of 60% or more.

This also makes it possible to manufacture an acoustic wave device having excellent device characteristics and the stability of the device characteristics.

A fourth aspect of the invention is also directed to a method of manufacturing an acoustic wave device. The method comprises the steps of preparing a substrate, providing a pair of electrodes on the substrate, forming a piezoelectric body layer composed of a piezoelectric material as its major component so as to cover the electrodes, and forming a silicon dioxide layer composed of silicon dioxide as its major component on the piezoelectric body layer, wherein in the silicon dioxide layer forming step, the silicon dioxide layer is formed by performing sputtering with a silicon dioxide target in an atmosphere of an oxygen flow rate ratio of 60% or more.

This also makes it possible to manufacture an acoustic wave device having excellent device characteristics and the stability of the device characteristics.

A fifth aspect of the invention is also directed to a method of manufacturing an acoustic wave device. The method comprises the steps of preparing a substrate, providing a silicon dioxide layer composed of silicon dioxide as its major component on the substrate, forming a pair of electrodes on the silicon dioxide layer, and forming a piezoelectric body layer composed of a piezoelectric material as its major component so as to cover the electrodes, wherein in the silicon dioxide layer providing step, the silicon dioxide layer is formed by performing sputtering with a silicon dioxide target in an atmosphere of an oxygen flow rate ratio of 60% or more.

This also makes it possible to manufacture an acoustic wave device having excellent device characteristics and the stability of the device characteristics.

DESCRIPTION OF EXEMPLARY EMBODIMENTS

Hereinafter, an acoustic wave device and a method of manufacturing an acoustic wave device in accordance with the invention will be described with reference to the accompanying drawings.

Figure 1:
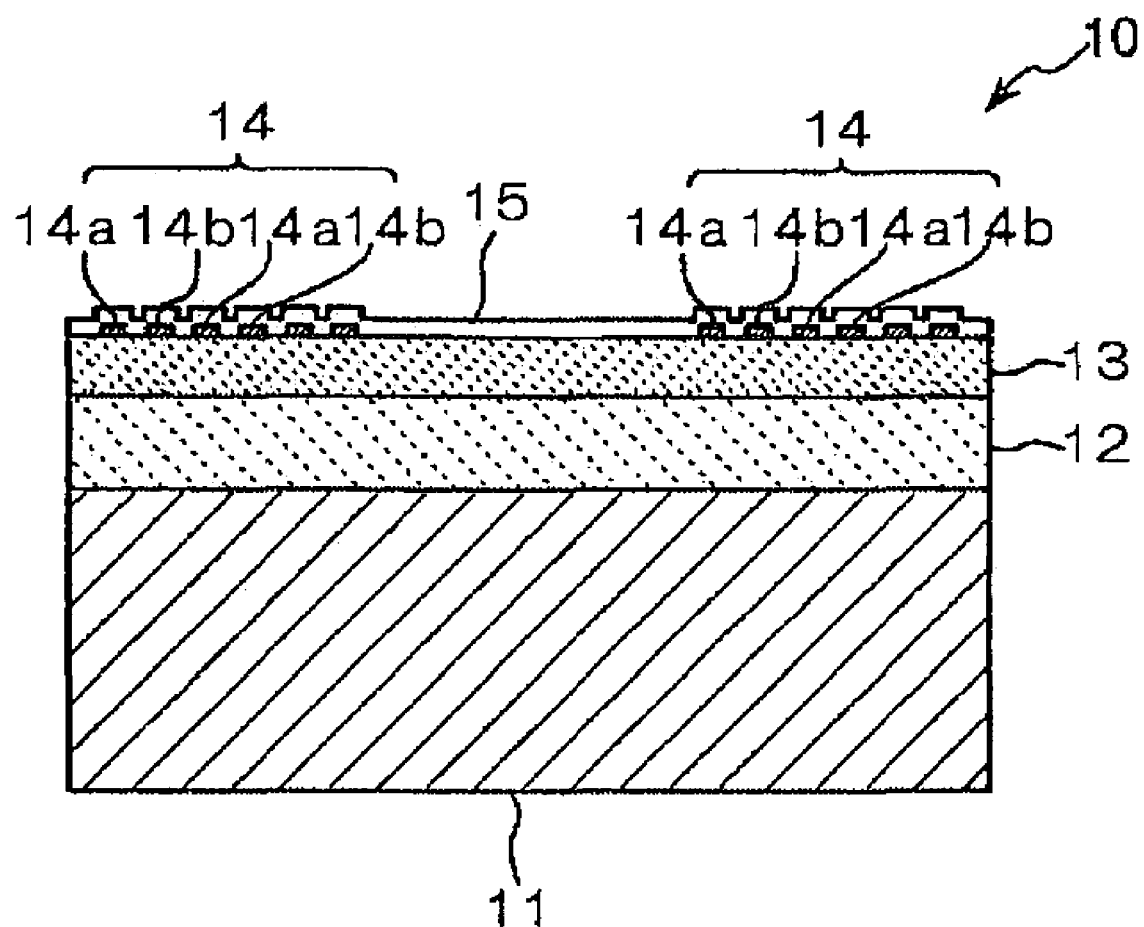
FIG. 1 is a sectional view showing a schematic configuration of an acoustic wave device in accordance with a preferable embodiment of the invention.

FIG. 1 is a sectional view showing a schematic configuration of an acoustic wave device in accordance with an embodiment of the invention. In this regard, it is to be noted that in the following description, the upper side in FIG. 1 will be referred to as "top" or "upper" and the lower side will be referred to as "bottom" or "lower", only for the sake of better understanding.

As shown in FIG. 1, the acoustic wave device 10 of the present embodiment is a transbasal-type surface acoustic wave element in which a substrate 11, a hard layer 12, a piezoelectric body layer 13, two comb-shaped electrode pairs (IDT: Inter-Digital Transducer) 14 and a silicon dioxide layer 15 are deposited in the named order.

In such an acoustic wave device 10, a surface acoustic wave is induced in the piezoelectric body layer 13 by inputting an electric signal to one of the two comb-shaped electrode pairs 14 and an electric signal of a specified frequency band is taken out from the other comb-shaped electrode pair 14.

Individual parts constituting the acoustic wave device 10 will now be described in order.

The substrate 11 is made of, e.g., various kinds of semiconductor materials such as Si, GaSi, SiGe, GaAs, STC, InP and the like, various kinds of ceramics materials such as glass and the like, and various kinds of resin materials such as polyimide, polycarbonate and the like.

Use of such a substrate 11 makes it possible to provide the acoustic wave device 10 having desired characteristics, while simplifying formation of the piezoelectric body layer 13.

In this regard, it is to be noted that the substrate 11 may be formed of a laminated body having a plurality of layers, as well as a single layered body. In the former case, each of the layers can be formed by arbitrarily combining the aforementioned materials.

A hard layer (base layer) 12 is formed on one surface (an upper surface) of the substrate 11.

The hard layer 12 serves to set the characteristics (conditions) of the surface acoustic wave induced in the piezoelectric body layer 13. Examples of such characteristics include an oscillatory frequency, an amplitude and a propagation speed.

The characteristics of the surface acoustic wave can be set to desired ones by providing the hard layer 12 and arbitrarily selecting the constituent material thereof.

Preferably, the constituent material of the hard layer 12 mainly composed of at least one of diamond, diamond-like carbon, silicon, sapphire, glass, quartz, lithium tantalite, potassium niobate and lithium niobate. More preferably, the constituent material of the hard layer 12 is mainly composed of at least one of diamond, diamond-like carbon, sapphire, lithium tantalite and potassium niobate. Most preferably, the constituent material of the hard layer 12 is diamond or diamond-like carbon.

An acoustic velocity of the surface acoustic wave can be increased by forming the hard layer 12 with these materials. As a result, it is possible to easily manufacture an acoustic wave device for high frequency. This also assists in changing the surface acoustic wave to a high frequency, which change is required for application in the field of high speed communication such as a wireless LAN or optical communication.

In this regard, the diamond-like carbon, which refers to a compound containing carbon atoms and hydrogen atoms and having an amorphous structure, is an optically transparent insulating body exhibiting hardness next to that of diamond.

According to the characteristics of the surface acoustic wave shown in the drawing, the hard layer 12 may be formed of a laminated body having a plurality of layers, as well as a single layered body. Moreover, the hard layer 12 is formed optionally and may be omitted.

The piezoelectric body layer 13 is formed on a surface (an upper surface) of the hard layer 12 opposite from the substrate 11.

The piezoelectric body layer 13 exhibits piezoelectricity and serves as a propagation medium of the surface acoustic wave.

The piezoelectric body layer 13 is composed of a piezoelectric material as its major component. Examples of the piezoelectric material include, but are not particularly limited to, ZnO, AlN, $LiTaO_3$, $LiNbO_3$, $KNbO_3$, ZnS, ZnSe and CdS.

The two comb-shaped electrode pairs 14 are formed on a surface (an upper surface) of the piezoelectric body layer 13 opposite from the hard layer 12.

One of the two comb-shaped electrode pairs 14 (an input side electrode pair) serves to apply an electric voltage to the piezoelectric body layer 13 to thereby induce a surface acoustic wave in the piezoelectric body layer 13, whereas the other of the two comb-shaped electrode pairs 14 (an output side electrode pair) has a function of detecting the surface acoustic wave propagating through the piezoelectric body layer 13, converting the surface acoustic wave to an electric signal and outputting the electric signal to the outside.

Each of the comb-shaped electrode pairs 14 is comprised of a pair of comb-shaped electrodes 14a and 14b each having a plurality of electrode fingers arranged side by side in a pectinate pattern. In each of the comb-shaped electrode pairs 14, the comb-shaped electrodes 14a and 14b are arranged to mesh with each other in a mutually spaced-apart relationship.

If a driving voltage is inputted to between the input side pair of comb-shaped electrodes 14a and 14b, a surface acoustic wave is induced in the piezoelectric body layer 13 and an electric signal of a specified frequency band is outputted from the output side pair of comb-shaped electrodes 14a and 14b by a filtering function of the latter.

In this connection, the distance between the pair of comb-shaped electrodes 14a and 14b corresponds to a wavelength of the surface acoustic wave induced and can be reduced to, e.g., about 1 μm. Moreover, the characteristics of a surface acoustic wave device 10 can be set as desired by adjusting the width, interval, thickness or the like of the electrode fingers of the comb-shaped electrodes.

Examples of a constituent material of the respective comb-shaped electrode pairs 14 (the respective comb-shaped electrodes 14a and 14b) include Al, Cu, W, Mo, Ti, Au, Y, Pb, Sc and alloy containing these elements, one or more of which may be used independently or in combination.

The silicon dioxide layer 15 composed of silicon dioxide as its major component is formed so as to cover the two comb-shaped electrode pairs 14. In the present embodiment, the silicon dioxide layer 15 is formed in such a manner as to make contact with the respective comb-shaped electrode pairs 14 and the piezoelectric body layer 13.

The silicon dioxide layer 15 has a function of compensating a temperature of the acoustic wave device 10 (e.g., reducing a variation in oscillatory frequency caused by a temperature change) and a function of protecting a surface of the acoustic wave device 10. In the present embodiment, the silicon dioxide layer 15 is adapted to completely cover the respective comb-shaped electrode pairs 14 and a propagation route of the surface acoustic wave induced by the comb-shaped electrode pairs 14.

As will be set forth later, the silicon dioxide layer 15 is formed by performing sputtering with a silicon dioxide target in an atmosphere of an oxygen flow rate ratio of 60% or more.

The silicon dioxide layer 15 noted above has an amorphous structure but is capable of reducing, in the amorphous structure, the number of ring-shaped structures having a three or more membered ring (especially, planar ring-shaped structures with a three membered ring) that are accompanied by structural defects, e.g., oxygen deficiency type defects.

Thus, the silicon dioxide layer 15 has a layer quality of reduced structural defects and therefore can improve the characteristics of the acoustic wave device 10. Furthermore, the silicon dioxide layer 15 has a reduced number of the ring-shape structures, such as a three membered ring (threefold ring), which form a chemically unstable planar ring structure.

Therefore, the silicon dioxide layer 15 exhibits good stability in layer quality and has an ability to keep the excellent characteristics of the acoustic wave device 10 over a prolonged period of time (to improve the stability in device characteristics).

Further, in a spectrum obtained by analyzing the silicon dioxide layer 15 with a Raman spectroscopy, when the intensity of a peak existing in a wave number region of 800 to 850 $cm^{-1}$ is defined by Ps and the intensity of a peak existing in a wave number region of 475 to 515 $cm^{-1}$ is defined by P4, the peak intensity ratio P4/Ps is preferably equal to or smaller than 1.2 and more preferably equal to or smaller than 1.1.

In this regard, the peak existing in a wave number region of 800 to 850 $cm^{-1}$ refers to a peak corresponding to an LO mode (a longitudinal optic mode) of Si—O bonds in the amorphous structure of the silicon dioxide layer 15, whereas the peak existing in a wave number region of 475 to 515 $cm^{-1}$ refers to a peak corresponding to a vibration mode of a four membered ring in the amorphous structure of the silicon dioxide layer 15.

Accordingly, if the peak intensity ratio P4/Ps in the spectrum satisfies the conditions noted above, it becomes possible to reduce the number of ring-shaped structures having a four membered ring (fourfold ring) which would be accompanied by structural defects. As a result, it is possible to improve the device characteristics of the acoustic wave device 10 and the stability of the device characteristics.

Moreover, since the peak corresponding to the ring-shaped structures having a four membered ring shows relatively high intensity, the peak intensity ratio P4/Ps can be used as an index that accurately reflects the layer quality of the silicon dioxide layer 15.

Furthermore, in a spectrum obtained by analyzing the silicon dioxide layer 15 with a Raman spectroscopy, when the intensity of a peak existing in a wave number region of 800 to 850 $cm^{-1}$ is defined by Ps and the intensity of a peak existing in a wave number region of 600 to 620 $cm^{-1}$ is defined by P3, the peak intensity ratio P3/Ps is preferably equal to or smaller than 1.0 and more preferably equal to or smaller than 0.97.

In this regard, the peak existing in a wave number region of 600 to 620 $cm^{-1}$ refers to a peak corresponding to the ring-shaped structures having a three membered ring.

Accordingly, if the peak intensity ratio P3/Ps in the spectrum satisfies the conditions noted above, it becomes possible to reduce the number of ring-shaped structures having a three membered ring which would be accompanied by structural defects. As a result, it is possible to improve the device characteristics of the acoustic wave device 10 and the stability of the device characteristics.

Moreover, although the peak corresponding to the ring-shaped structures having a three membered ring is relatively small, the ring-shaped structures having a three membered ring is of a planar ring structure and is chemically unstable, thus showing a close relationship with the structural defects in the amorphous structure.

Therefore, the peak intensity ratio P3/Ps is suitable for use as an index that reflects the layer quality of the silicon dioxide layer 15.

Moreover, in a spectrum obtained by analyzing the silicon dioxide layer 15 with a Raman spectroscopy, when the integral value of the intensity in a wave number region of 250 to 510 $cm^{-1}$ is defined by I1 and the integral value of the intensity in a wave number region of 800 to 840 $cm^{-1}$ is defined by I2, the intensity integral value ratio I1/I2 is preferably equal to or smaller than 50.

In this regard, the wave number region of 250 to 510 $cm^{-1}$ refers to a region where a peak group corresponding to the ring-shaped structures having a four or more membered ring exists, whereas the wave number region of 800 to 840 $cm^{-1}$ refers to a region where a peak corresponding to the aforementioned LO mode exists.

Accordingly, if the intensity integral value ratio I1/I2 in the spectrum satisfies the conditions noted above, it becomes possible to reduce the number of ring-shaped structures having a four or more membered ring which would be accompanied by structural defects. As a result, it is possible to improve the device characteristics of the acoustic wave device 10 and the stability of the device characteristics.

Moreover, it is considered that the peak corresponding to the ring-shaped structures having a four or more membered ring exhibits increased intensity and shows a high content ratio in the amorphous structure.

Therefore, the intensity integral value ratio I1/I2 can be used as a good index that accurately represents the degree of structural defects.

Further, in the silicon dioxide layer 15, the constant term A of a Cauchy dispersion formula represented by the following equation (I) is preferably 1.44 to 1.46:

$$n^2 = A + B/\lambda^2 \quad (I)$$

where the $\lambda$ is a wavelength of the light, the n is a refractive index of the silicon dioxide layer to the light having a wavelength of $\lambda$, and each of the A and B is a constant.

In this regard, the constant term A is a term that does not depend on the wavelength of $\lambda$. It is to be noted that the dispersion formula represented above is a simple equation that omits the term of a higher order than the term of $\lambda^{-2}$ (the term having a factor B).

If the constant term A satisfies the conditions noted above, it becomes possible to reduce the number of ring-shaped structures having a three or more membered ring and consequently to improve the device characteristics of the acoustic wave device 10 and the stability of the device characteristics. In particular, the constant term A is preferably 1.44 to 1.45, because the silicon dioxide layer 15 can be easily formed by a sputtering method if such is the case.

The acoustic wave device 10 configured as above can be manufactured in the following manner.

FIG. 2 is a view (a sectional view) for explaining a manufacturing method of the acoustic wave device shown in FIG. 1. FIG. 3 is a view showing a schematic configuration of one example of a sputtering device used in forming the silicon dioxide layer of the acoustic wave device shown in FIG. 1.

The manufacturing method of the acoustic wave device 10 includes (1) a step of forming a hard layer 12, (2) a step of forming a piezoelectric body layer 13, (3) a step of forming two comb-shaped electrode pairs 14 and (4) a step of forming a silicon dioxide layer 15.

Hereinafter, the respective steps will be described one by one.

(1) Step of Forming a Hard Layer 12

Figure 2A:
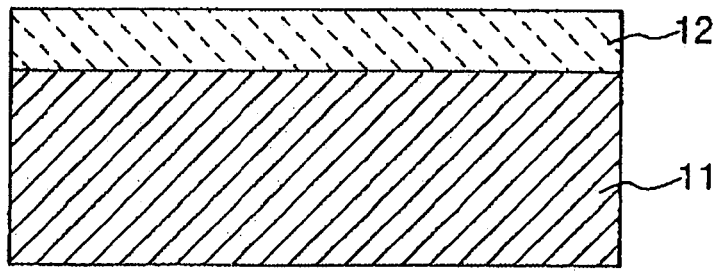
FIG. 2 is a view for explaining a manufacturing method of the acoustic wave device shown in FIG. 1.
Figure 3:
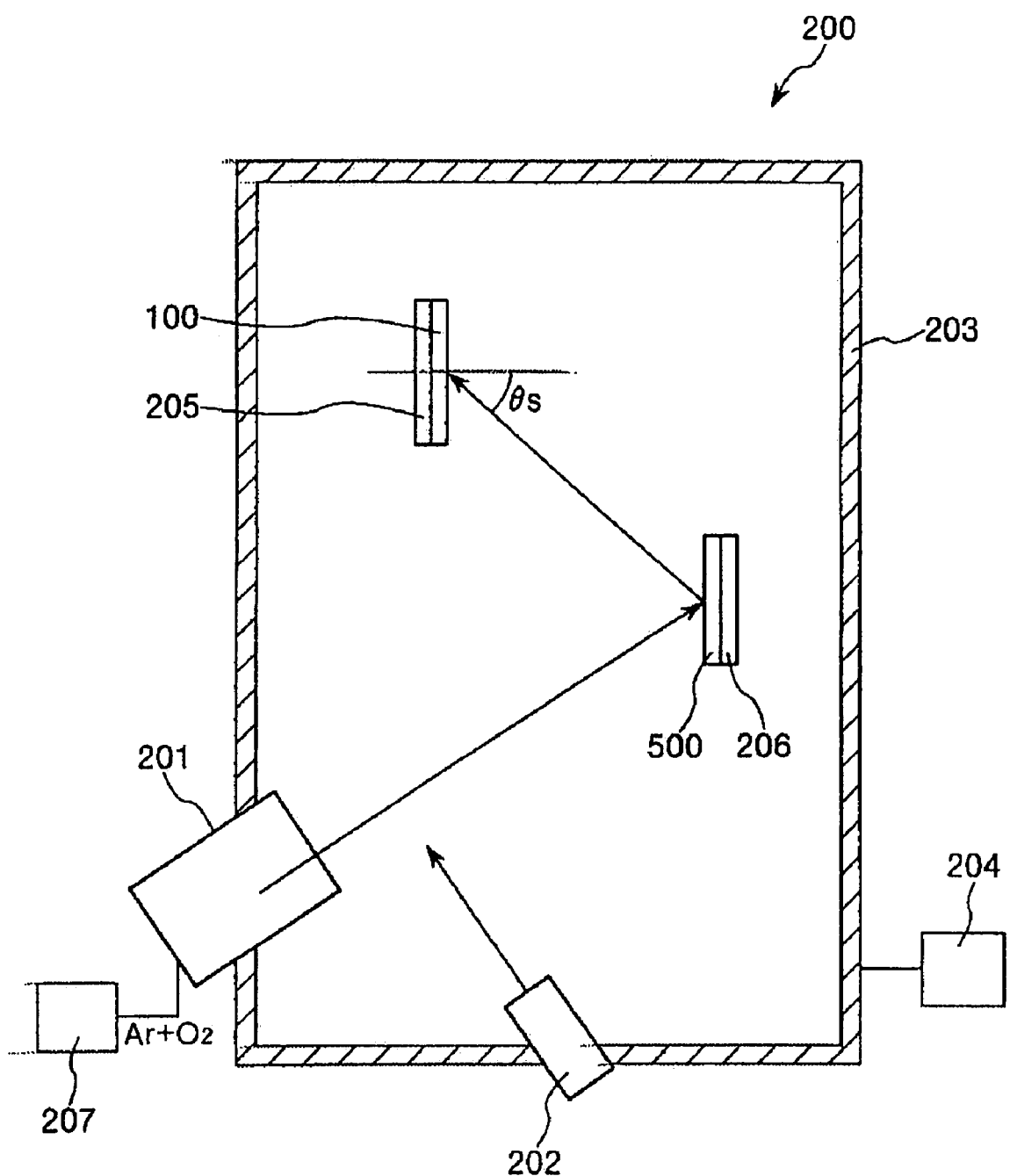
FIG. 3 is a sectional view showing a schematic configuration of one example of a sputtering device used in forming the silicon dioxide layer of the acoustic wave device shown in FIG. 1.

A substrate 11 is first prepared and a hard layer 12 is formed on the substrate 11, as illustrated in FIG. 2A.

The hard layer 12 can be formed by using, e.g., chemical vapor deposition (CVD) such as plasma CVD, thermal CVD and laser CVD, dry plating such as vacuum deposition, sputtering and ion plating, wet plating such as electrolytic plating, immersion plating and non-electrolytic plating, thermal spraying, bonding of sheet-like members and so forth.

Particularly, in the case where the hard layer 12 is composed of diamond, it can be formed by sputtering, ion plating, CVD, electron beam vapor deposition or the like. Further, in the case where the hard layer 12 is composed of diamond-like carbon, it can be formed by plasma CVD, ion beam vapor deposition, sputtering or the like.

(2) Step of Forming a Piezoelectric Body Layer 13

Figure 2B:
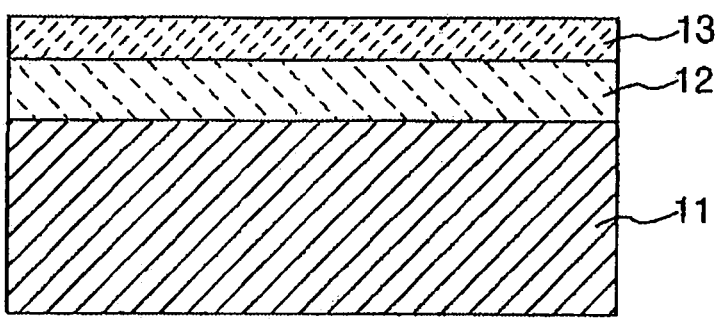

Next, as illustrated in FIG. 2B, a piezoelectric body layer 13 is formed on the hard layer 12. The same method as used in forming the hard layer 12 in the step (2) can be used in order to form the piezoelectric body layer 13.

(3) Step of Forming a Comb-Shaped Electrode Pairs 14

Figure 2C:
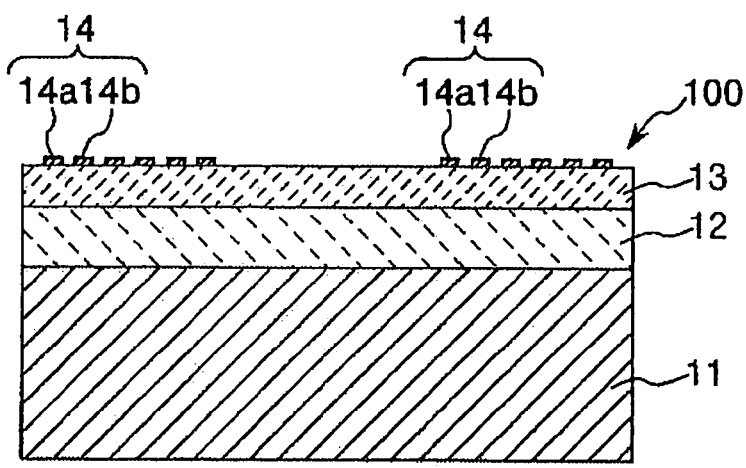

Next, as illustrated in FIG. 2C, two comb-shaped electrode pairs 14 are formed on the piezoelectric body layer 13. At this time, the comb-shaped electrode pairs 14 are obtained by, e.g., forming an electrically conductive material layer on the piezoelectric body layer 13 and then etching the electrically conductive material layer by use of a mask having a shape corresponding to the two comb-shaped electrode pairs 14.

This produces a base member 100, i.e., a structural body, in which the hard layer 12, the piezoelectric body layer 13 and the comb-shaped electrode pairs 14 are sequentially layered on the substrate 11.

The electrically conductive material layer can be formed by using, e.g., dipping, printing, wet plating such as electrolytic plating, immersion plating and non-electrolytic plating, chemical vapor deposition (CVD) such as plasma CVD, thermal CVD and laser CVD, dry plating such as vacuum deposition, sputtering and ion plating, thermal spraying, bonding of metal foils and so forth.

On the other hand, the etching process can be performed by using, e.g., dry etching such as reactive ion etching (RIE), plasma etching, beam etching and light-assisted etching, wet etching and so forth.

(4) Step of Forming a Silicon Dioxide Layer 15

Figure 2D:
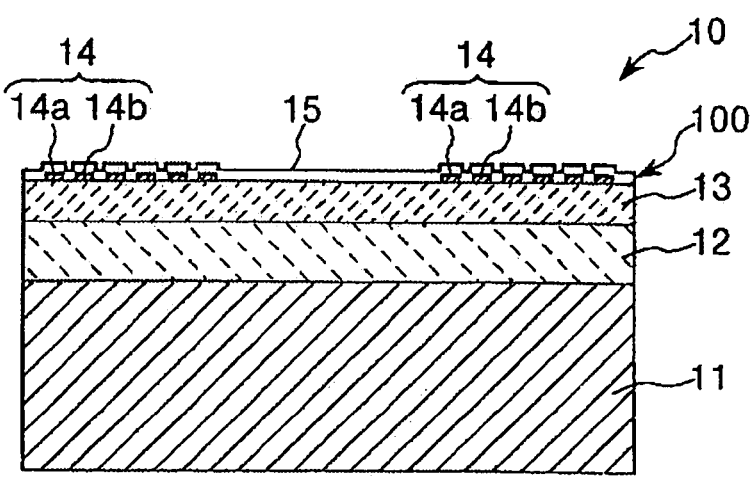

Next, as illustrated in FIG. 2D, a silicon dioxide layer 15 is formed on the piezoelectric body layer 13 so as to cover the two comb-shaped electrode pairs 14.

The silicon dioxide layer 15 can be formed by sputtering through the use of, e.g., a radio frequency (RF) magnetron sputtering device or an electron cyclotron resonance (ECR) sputtering device.

In these sputtering devices, sputtering is performed by use of a silicon dioxide target in a state that a device chamber is evacuated to a specified internal pressure, while supplying an inert gas such as Ar or the like and an oxygen gas to the device chamber to thereby maintain an atmosphere of an oxygen flow rate ratio of 60% or more.

Describing more specifically, the silicon dioxide layer 15 is formed by using, e.g., a sputtering device 200 as shown in FIG. 3.

The sputtering device 200 shown in FIG. 3 includes an ion source (an ion beam source) 201 for irradiating an ion beam, a neutralizer 202 for emitting electrons toward the ion beam, a vacuum chamber 203, an evacuation pump 204 for controlling a pressure within the vacuum chamber 203, a base member holder 205 for holding, in the vacuum chamber 203, the base member 100 on which the silicon dioxide layer 15 is to be formed, and a target retention member (a backing plate) 206 for retaining a target 500 in place.

The ion source 201 is adapted to irradiate the ion beam and, in the present embodiment, an RF ion source is used as the ion source 201. In the ion source (RF ion source) 201, an oxygen-containing gas is supplied from a gas source 207 and ionized (brought to plasma) by RF discharge. Then, by applying an electric voltage to between grids (not shown), the gas thus ionized (brought to plasma) is projected as an ion beam.

The neutralizer 202 is adapted to emit electrons toward the ion beam. By doing so, it is possible to prevent or suppress an excessive quantity of charges from staying in the target 500 or the like and, even in the case of continuous film formation, it is possible to ensure that sputtering particles are stably drawn to the base member 100.

Further, the target retention member 206 is typically made of metallic materials exhibiting good heat conductivity, such as stainless steel, copper, copper alloy and the like. In the process of forming the silicon dioxide layer 15, the target 500 is secured to the target retention member 206 through a bonding agent such as In or the like.

At the time when the silicon dioxide layer 15 is formed using the sputtering device 200 configured as above, the target 500 made of $SiO_2$ is first placed on the target retention member 206 within the vacuum chamber 203.

Then, the base member 100 (a structural body in which the hard layer 12, the piezoelectric body layer 13 and the comb-shaped electrode pairs 14 are sequentially layered on the substrate 11) is held on the base member holder 205 within the vacuum chamber 203.

Thereafter, the vacuum chamber 203 is depressurized by means of the evacuation pump 204.

Next, a gas (an oxygen-containing gas which will be described later) is supplied from the gas source 207 into the ion source 201 and ionized (brought to plasma). By performing discharge (RF discharge or DC discharge) in the ion source 201, the gas thus introduced is ionized (brought to plasma).

Then, by applying an electric voltage to between grids not shown in the drawings, the gas thus ionized (brought to plasma) is accelerated and projected toward the target 500 as an ion beam.

As described above, the neutralizer 202 is adapted to emit electrons toward the ion beam projected from the ion source 201. This electrically neutralizes the ion beam projected from the ion source 201.

Owing to this fact, it is possible to prevent or suppress an excessive quantity of charges from staying in the target 500 or the like and, even in the case of continuous film formation, it is possible to ensure that sputtering particles are stably drawn to the base member 100.

The ion beam projected from the ion source 201 (namely, the beam electrically neutralized by the electrons emitted from the neutralizer 202) is impinged against the target 500. Thus, sputtering particles are drawn out from the target 500 and are then incident and deposited on the base member 100.

As the ion beam continues to be irradiated in this manner, the incidence and deposition of the sputtering particles on the base member 100 goes on to thereby form the silicon dioxide layer 15 on the base member 100. This produces the acoustic wave device 10.

In this regard, at the time of forming the silicon dioxide layer 15 by sputtering, it is usual in the prior art that the sputtering is carried out in an atmosphere of an oxygen flow rate ratio of about 20 to 40%.

The present inventors have found that, by performing the sputtering in an atmosphere of an oxygen flow rate ratio of 60% or more, it is possible to reduce the ratio of ring-shaped structures having a three or more membered ring in the amorphous structure of a silicon dioxide layer and, in other words, it is possible to obtain a silicon dioxide layer with reduced structural defects.

For example, in the case where the silicon dioxide layer 15 is formed using the sputtering device 200 noted above, the gas source 207 supplies to the ion source 201 a gas (e.g., an oxygen-argon mixture gas) having an oxygen flow rate ratio of 60% or more.

That is to say, an oxygen gas is supplied into the vacuum chamber 203 in an oxygen flow rate ratio of 60% or more. In this regard, it is to be noted that in the present embodiment, the oxygen gas is supplied into the vacuum chamber 203 by way of the ion source 201.

However, it may be possible to directly supply the oxygen gas into the vacuum chamber 203 without going through the ion source 201. In this case, as long as the oxygen gas is supplied into the vacuum chamber 203 in an oxygen flow rate ratio of 60% or more, the gas source 207 may supply to the ion source 201 either an oxygen-argon mixture gas or an argon gas only.

Further, the gas supplied from the gas source 207 to the ion source 201 (namely, a plasma-generating gas) is not limited to the argon gas and the oxygen gas.

In this connection, the term "oxygen flow rate ratio" refers to the ratio of an oxygen gas flow rate in the total flow rate of gases introduced into the vacuum chamber 203 at the time of sputtering.

For instance, in the case where an inert gas and an oxygen gas are introduced into the vacuum chamber 203 during the course of sputtering, the oxygen flow rate ratio is defined by an oxygen gas flow rate (sccm) divided by an inert gas flow rate (sccm) plus the oxygen gas flow rate (sccm). Further, the oxygen flow rate ratio corresponds to a partial pressure ratio of the oxygen gas in an internal pressure of the vacuum chamber 203.

Although the oxygen gas is supplied into the vacuum chamber 203 in an oxygen flow rate ratio of 60% or more as described above, it is preferred that the oxygen gas is supplied into the vacuum chamber 203 in an oxygen flow rate ratio of 75 to 95%. This ensures that the silicon dioxide layer 15 having reduced structural defects can be obtained in a simple and reliable manner.

In contrast, if the oxygen flow rate ratio exceeds the upper limit value noted above (if the oxygen flow rate ratio becomes too great), there is a tendency that the sputtering efficiency show reduction.

Furthermore, the gases introduced from the gas source 207 into the ion source 201 may have either a fixed composition or a composition changing over time. For example, the oxygen concentration (the oxygen flow rate ratio) of the gases introduced into the ion source 201 may be changed over time.

In this case, if an argon-oxygen mixture gas is used as the gases introduced into the ion source 201 and if the oxygen concentration (the oxygen flow rate ratio) in the mixture gas is changed over time, it is possible at an early stage to efficiently generate plasma by increasing the ratio of an argon gas which can more easily bring to plasma than an oxygen gas ($O_2$) and, at a later stage, it is possible to irradiate an ion beam containing a high concentration of oxygen.

The acoustic wave device 10 of the invention is manufactured through the steps as set forth above. The electrical characteristics and temperature characteristics of the acoustic wave device 10 can be confirmed by use of, e.g., a network analyzer.

Other Embodiments

The invention is not limited to the foregoing configuration but may be applicable to other configurations, as long as the silicon dioxide layer makes contact with at least one of the piezoelectric body layer and the comb-shaped electrode pairs.

In addition to the above configuration of the acoustic wave device 10, other configuration examples of the acoustic wave device to which the invention is applicable will be now described.

FIG. 4 is a sectional view showing other configuration examples of the acoustic wave device to which the invention is applicable. In the following description, the same constituent parts as in the foregoing embodiment will be omitted from description.

Figure 4A:
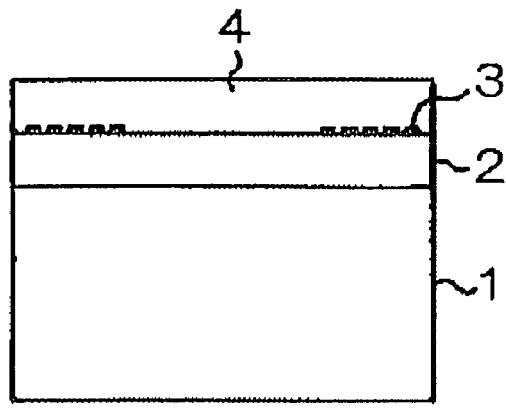
FIG. 4 is a sectional view showing other configuration examples of the acoustic wave device to which the invention is applicable.

In an acoustic wave device shown in FIG. 4A, a piezoelectric body layer 2 identical with the piezoelectric body layer 13, two comb-shaped electrode pairs 3 identical with the comb-shaped electrode pairs 14 and a silicon dioxide layer 4 identical with the silicon dioxide layer 15 are deposited on a substrate 1 identical with the substrate 11 in the named order.

Figure 4B:
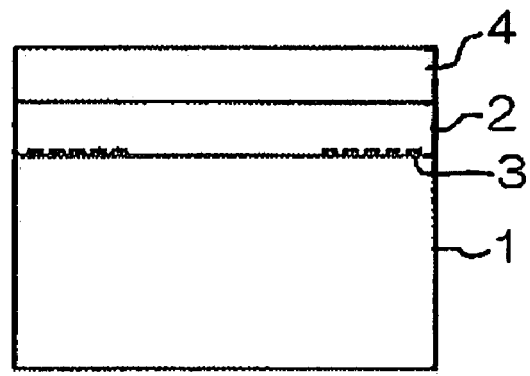

In an acoustic wave device shown in FIG. 4B, two comb-shaped electrode pairs 3, a piezoelectric body layer 2 and a silicon dioxide layer 4 are deposited on a substrate 1 in the named order.

Figure 4C:
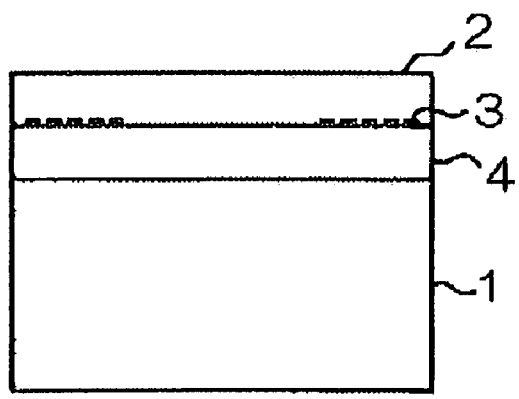

In an acoustic wave device shown in FIG. 4C, a silicon dioxide layer 4, two comb-shaped electrode pairs 3 and a piezoelectric body layer 2 are deposited on a substrate 1 in the named order.

Figure 4D:
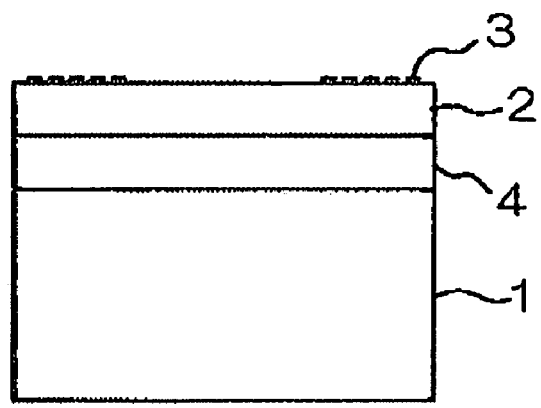

In an acoustic wave device shown in FIG. 4D, a silicon dioxide layer 4, a piezoelectric body layer 2 and two comb-shaped electrode pairs 3 are deposited on a substrate 1 in the named order.

Advantageous effects of the invention are attainable in the case where the silicon dioxide layer makes contact with at least one of the piezoelectric body layer and the comb-shaped electrode pairs as set forth above. Particularly, advantageous effects of the invention become conspicuous in the case where the silicon dioxide layer makes contact with both the piezoelectric body layer and the comb-shaped electrode pairs as shown in FIGS. 1, 4A and 4C.

While the present acoustic wave device has been described in respect of preferred embodiments, the invention is not limited to the embodiments described and illustrated above. It should be understood that many changes or modifications may be made without departing from the spirit and scope of the invention.

More specifically, although a surface acoustic wave element has be described as an example of the acoustic wave device in the foregoing embodiments, the invention is not limited to the surface acoustic wave element but may be equally applied to various kinds of piezoelectric vibration elements.

Examples of such piezoelectric vibration elements include a bulk acoustic wave (BAW) element of the structure in which front and rear surfaces of a piezoelectric body are sandwiched between electrodes.

More specific examples of the piezoelectric vibration elements include an element having a film bulk acoustic resonator (FBAR) type element structure and an element having a solid mounted resonator (SMR) type element structure in which a sound-reflecting multilayer film having alternately and repeatedly deposited layers of different sound impedances is arranged between the afore-mentioned layer structure and the substrate.

Furthermore, the electrode structure is not limited to the illustrated example but may be configured differently according to the application thereof. As an example, in the case of manufacturing a resonator, a pair of reflectors may be arranged in a spaced-apart relationship on the opposite sides of a comb-shaped electrode pair that constitutes input and output electrodes.

Moreover, in the foregoing embodiment (shown in FIG. 1), a short-circuiting electrode made of aluminum or gold may be formed on a surface (a lower surface in the drawings) of the piezoelectric body layer 13 opposite from the comb-shaped electrode pairs 14. In this case, the short-circuiting electrode may be formed only within a formation region of the comb-shaped electrode pairs 14, when viewed from the top thereof, or may be formed to cover a propagation region.

Presence of the short-circuiting electrode makes it possible to potential-equalize a surface of the piezoelectric body layer 13 opposite from the surface on which the comb-shaped electrode pairs 14 are formed, thereby increasing excitation efficiency.

EXAMPLES

Now, description will be made on concrete examples of the invention.

1. Manufacture of an Acoustic Wave Device

Example 1

An acoustic wave device having the configuration as shown in FIG. 1 was manufactured.

More specifically, a substrate (a silicon substrate having an average thickness of 800 μm), on which a hard layer (a polycrystalline diamond film having an average thickness of 20 μm) was formed, was first prepared.

Then, a piezoelectric body layer was formed by building up ZnO on the hard layer by RF sputtering up to a thickness of 475 nm. At this time, the RF sputtering was performed by using a sintered body of ZnO as a target material and using a mixture gas of an argon gas (in a flow rate of 50 sccm) and an oxygen gas (in a flow rate of 50 sccm) as a reaction gas, under the conditions that an RF power was 1.0 kW, a gas pressure (an atmospheric pressure) was 1.0 Pa and a film formation temperature was 500° C.

Subsequently, a metallic material layer having an average thickness of 42 nm was formed by coating aluminum on the formed piezoelectric body layer by DC sputtering. The DC sputtering was performed by using an aluminum plate as a target material and using an argon gas (in a in a flow rate of 50 sccm) as a reaction gas, under the conditions that a DC power was 1.0 kW, a gas pressure was 1.0 Pa and a film formation temperature was equal to room temperature.

Next, two comb-shaped electrode pairs (input and output electrodes) were formed by forming a desired resist layer for formation of the comb-shaped electrode pairs on the formed metallic material layer by photolithography, performing reactive ion etching (RIE) using the resist layer as a mask, and removing unnecessary portions of the metallic material layer. At this time, a gas composed of $BCl_3$ and $Cl_2$ as its major component was used as an etching gas for the reactive ion etching.

Next, $SiO_2$ was coated on the piezoelectric body layer and the comb-shaped electrode pairs by RF magnetron sputtering so as to cover the two comb-shaped electrode pairs, thereby forming a silicon dioxide layer having an average thickness of 420 nm.

At this time, the silicon dioxide layer was formed by using molten quartz as a target and supplying an argon gas and an oxygen gas into a vacuum chamber, under the conditions that a high frequency of 13.56 MHz was applied to a cathode, an RF power was 1.0 kW, a gas pressure was 0.5 Pa and a film formation temperature was 200° C.

Moreover, during the process of supplying the argon gas and the oxygen gas into the vacuum chamber, the flow rate of the argon gas was 5 sccm, the flow rate of the oxygen gas was 45 sccm, and the oxygen flow rate ratio (the oxygen gas flow rate divided by the argon gas flow rate plus the oxygen gas flow rate) was 90%.

The acoustic wave device of Example 1 was manufactured through the process as noted above.

Example 2

An acoustic wave device was manufactured by performing the same process as in Example 1, except that the oxygen flow rate ratio was changed to 80% at the time of forming the silicon dioxide layer.

Comparative Example 1

An acoustic wave device was manufactured by performing the same process as in Example 1, except that the oxygen flow rate ratio was changed to 34% at the time of forming the silicon dioxide layer.

Comparative Example 2

An acoustic wave device was manufactured by performing the same process as in Example 1, except that an electron cyclotron resonance (ECR) sputtering device was used in a metal mode at the time of forming the silicon dioxide layer.

At this time, the ECR sputtering for formation of the silicon dioxide layer was performed under the conditions that a microwave power was 500 W, a high frequency power was 500 W, a coil current was 26 A/26 A, an oxygen flow rate ratio was 16% and a gas pressure was 0.145 Pa.

Comparative Example 3

An acoustic wave device was manufactured by performing the same process as in Example 1, except that an electron cyclotron resonance (ECR) sputtering device was used in an oxide mode at the time of forming the silicon dioxide layer.

At this time, the ECR sputtering for formation of the silicon dioxide layer was performed under the conditions that a microwave power was 500 W, a high frequency power was 500 W, a coil current was 26 A/26 A, an oxygen flow rate ratio was 18.5% and a gas pressure was 0.156 Pa.

2. Evaluation

The silicon dioxide layers of the acoustic wave devices manufactured in the respective Examples and Comparative Examples were analyzed by a Raman spectroscopy.

Raman Spectroscopy Spectrum

Raman spectroscopy spectra were measured with respect to the silicon dioxide layers of the acoustic wave devices manufactured in the respective Examples and Comparative Examples. The results are shown in FIGS. 5 and 6.

Figure 5:
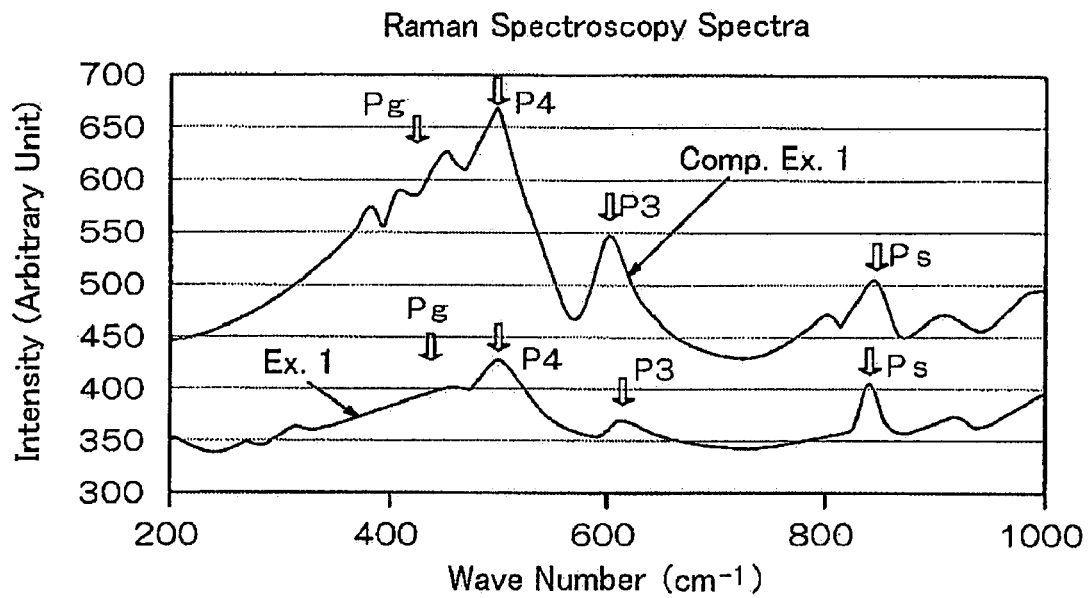
FIG. 5 is a graph representing Raman spectroscopy spectra of the silicon dioxide layers of Example 1 and Comparative Example 1.
Figure 6:
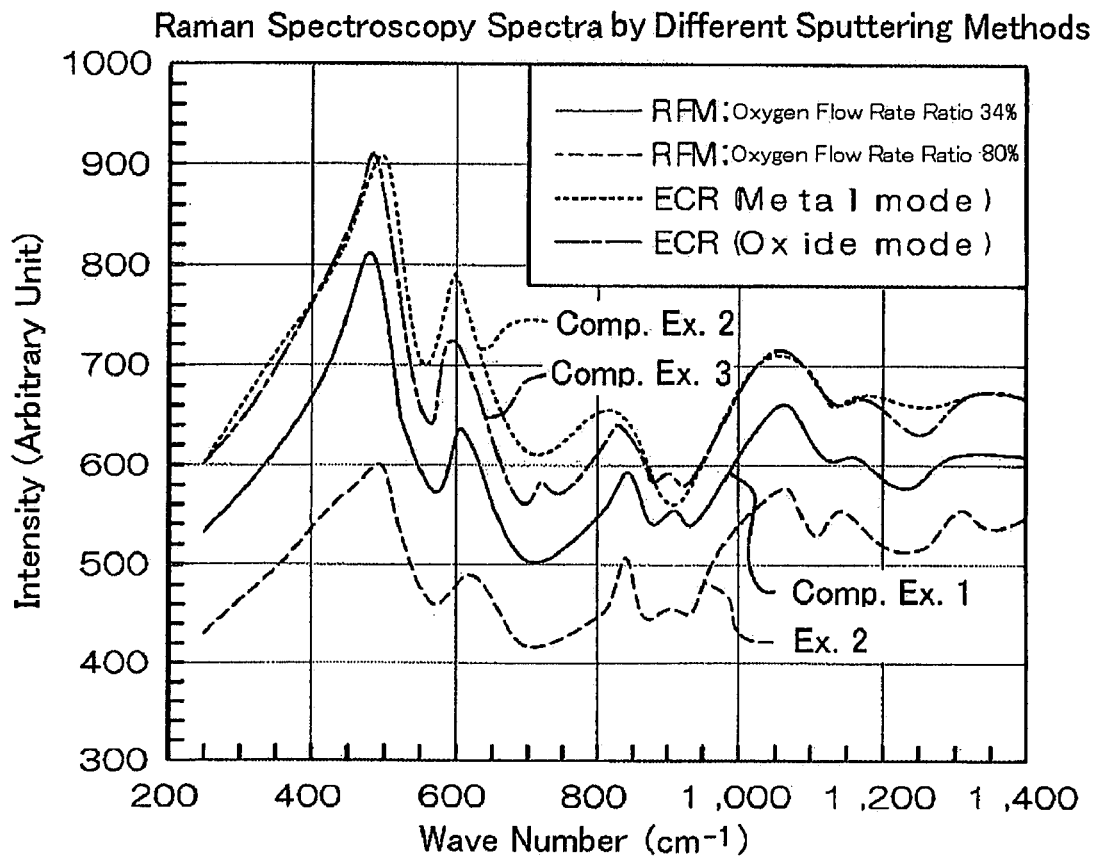
FIG. 6 is a graph representing Raman spectroscopy spectra of the silicon dioxide layers of Example 2 and Comparative Examples 1 to 3.

FIG. 5 is a graph representing Raman spectroscopy spectra of the silicon dioxide layers of Example 1 and Comparative Example 1. FIG. 6 is a graph representing Raman spectroscopy spectra of the silicon dioxide layers of Example 2 and Comparative Examples 1 to 3.

When measuring the Raman spectroscopy spectra, evaluation specimens, obtained by forming a thin aluminum film of 30 nm on a silicon substrate by sputtering and then forming a silicon dioxide layer on the thin aluminum film by the same methods as used in the Examples and Comparative Examples, were used.

Furthermore, when measuring the Raman spectroscopy spectra, laser light of 514.5 nm in wavelength (an Ar laser) was used as a light source. The laser light was irradiated on a surface of the silicon dioxide layer, the Raman scattering light of which was split by a spectrometer (a double monochromator) was detected by a photomultiplier tube.

As illustrated in FIGS. 5 and 6, in all Raman spectroscopy spectra in respect of the respective Examples and Comparative Examples, a peak Ps corresponding to LO-mode lattice vibration of a Si—O bond was observed near a wave number of 840 cm$^{-1}$, a peak P3 corresponding to lattice vibration of a three membered ring was observed near a wave number of 610 cm$^{-1}$, and a peak P4 corresponding to lattice vibration of a four membered ring was observed near a wave number of 495 cm$^{-1}$.

Furthermore, a peak group Pg was found in a wave number extent (of about 370 to 500 cm$^{-1}$) ranging from the peak P4 of the maximum wave number region toward the low wave number side thereof. This peak group Pg includes the peak P4 and a plurality of peaks corresponding to lattice vibration caused by ring-shaped structures having a four or more membered ring.

Ring-shaped structures having a three membered ring or a four or more membered ring are accompanied by structural defects (e.g., an oxygen deficiency type defect), which means that the greater the intensity of the peaks P3 and P4 and the peak group Pg, the worse the layer quality.

Peak Intensity Ratio of Raman Spectroscopy Spectra

As is apparent from FIG. 5, the intensity of the peaks P3 and P4 and the peak group Pg is relatively high in Comparative Example 1. In contrast, the intensity of all the peaks P3 and P4 and the peak group Pg is relatively low in Example 1.

In this regard, intensity ratios (P3/Ps and P4/Ps) of the intensity of peak Ps to the intensity of peaks P3 and P4 were calculated in respect of Example 1, Example 2 and Comparative Example 1. The results are shown in FIG. 7.

Figure 7:
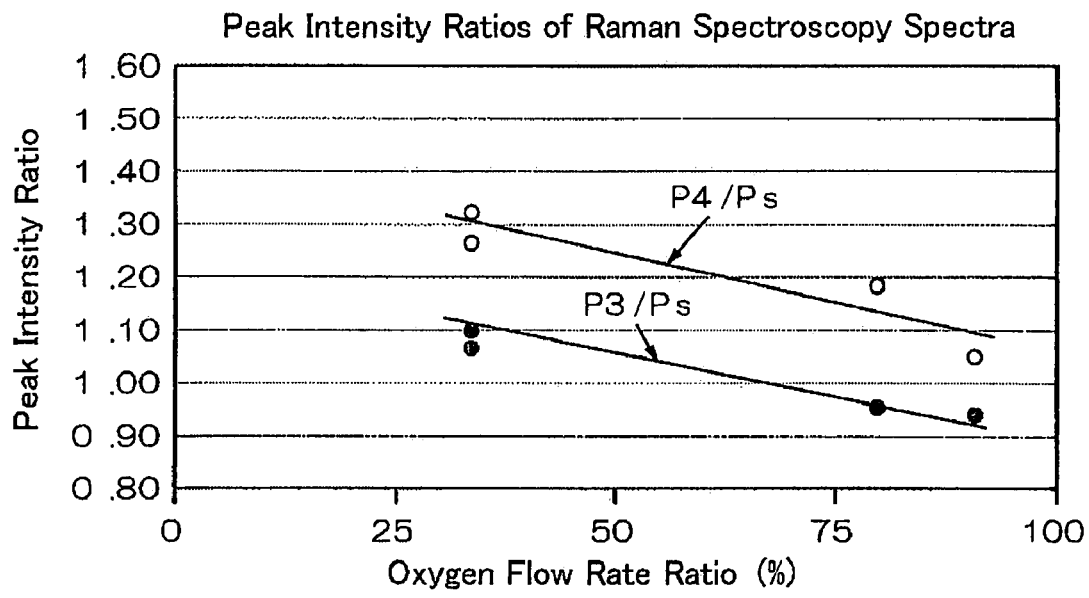
FIG. 7 is a graph representing a relationship between the peak intensity ratios of Raman spectroscopy spectra of the silicon dioxide layer and the oxygen flow rate ratio at the time of sputtering.

FIG. 7 is a graph representing a relationship between the peak intensity ratios of Raman spectroscopy spectra of the silicon dioxide layer and the oxygen flow rate ratio at the time of sputtering.

As is apparent from FIG. 7, the intensity ratios P3/Ps and P4/Ps are all decreased in proportion to an increase of the oxygen flow rate ratio. Thus, it can be seen that the intensity ratios are correlated with the oxygen flow rate ratio.

In Comparative Example 1, the intensity ratio P3/Ps was 1.10 and the intensity ratio P4/Ps was 1.27. Further, in Comparative Example 2, the intensity ratio P3/Ps was 1.07 and the intensity ratio P4/Ps was 1.32. On the other hand, in Example 1, the intensity ratio P3/Ps was 0.94 and the intensity ratio P4/Ps was 1.05. Further, in Example 2, the intensity ratio P3/Ps was 0.96 and the intensity ratio P4/Ps was 1.19.

In this regard, it is to be noted that since the peak P3 corresponds to a three membered ring having a close relationship with structural defects, the intensity ratio P3/Ps is suitable for use as an index indicating a layer quality of the silicon dioxide layer. However, since the peak P3 exhibits low peak intensity, the measurement accuracy of the intensity ratio P3/Ps is not always high.

On the other hand, the peak P4 corresponds to a four membered ring and the peak intensity thereof is greater than that of the peak P3. Thus, the measurement accuracy of the intensity ratio P4/Ps is high, consequently providing a more accurate index that indicates a layer quality of the silicon dioxide layer.

In the meantime, a ratio I1/I2 of the intensity integral value I1 in a wave number region of 250 to 510 cm$^{-1}$ to the intensity integral value I2 in a wave number region of 800 to 840 cm$^{-1}$ was calculated in the Raman spectroscopy spectra set forth above. The ratio I1/I2 in Comparative Example 1 was 53, whereas the ratio I1/I2 in Example 1 was 48.

Annealing-Dependent Change in Raman Spectroscopy Spectra

The silicon dioxide layers obtained in Example 1 and Comparative Example 1 were subjected to an annealing treatment, before and after which Raman spectroscopy spectra were measured in the same method as described above. The results are shown in FIGS. 8 and 9.

Figure 8:
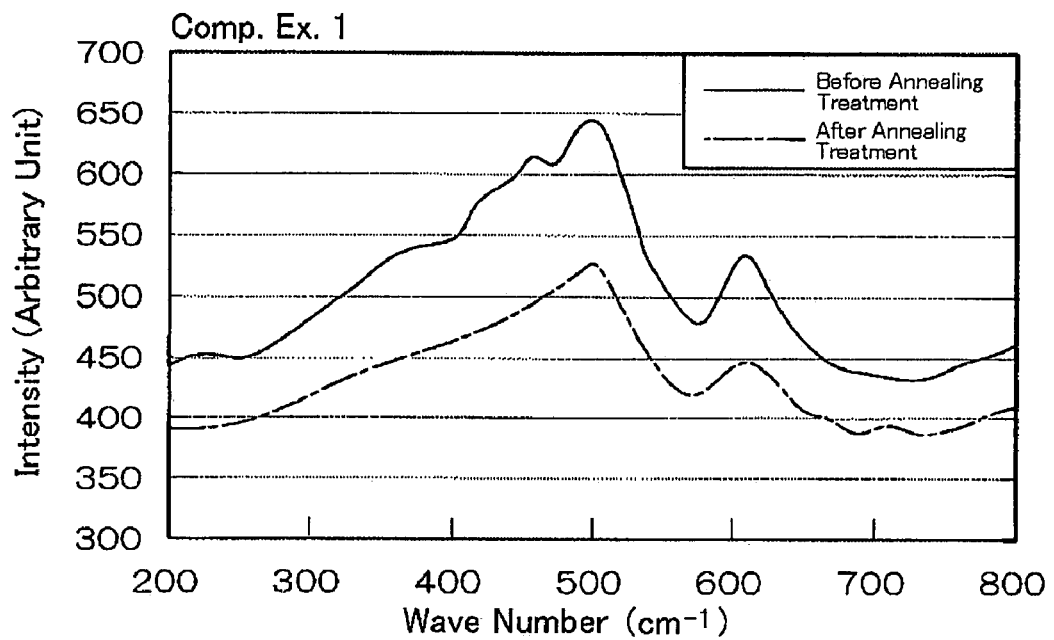
FIG. 8 is a graph representing Raman spectroscopy spectra before and after the silicon dioxide layer of Comparative Example 1 undergoes an annealing treatment.
Figure 9:
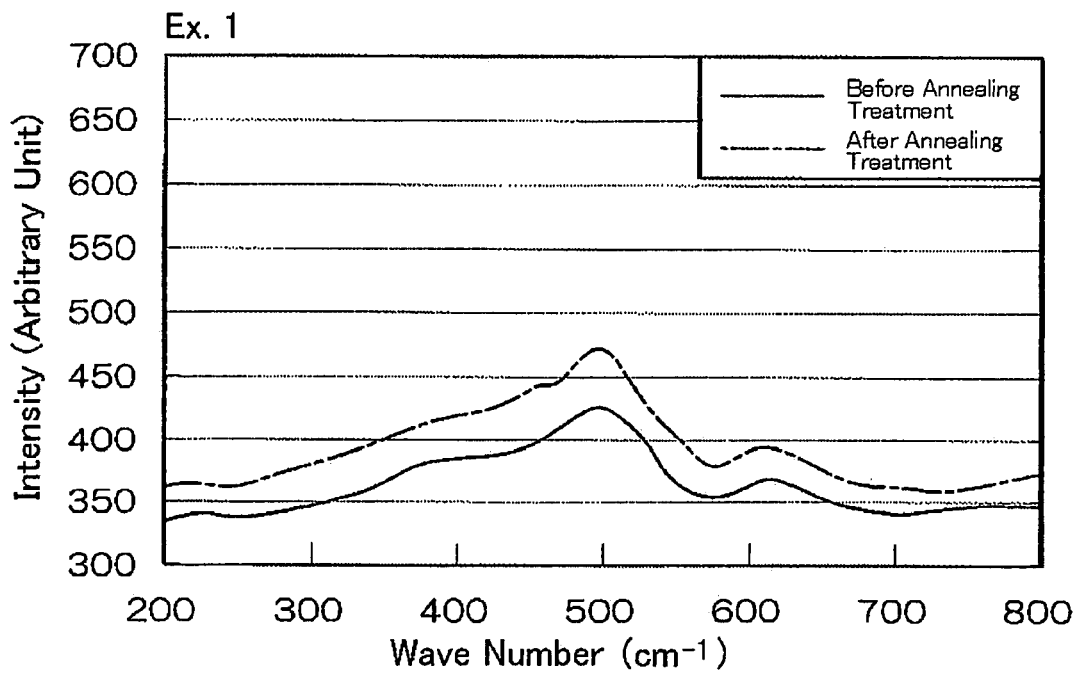
FIG. 9 is a graph representing Raman spectroscopy spectra before and after the silicon dioxide layer of Example 1 undergoes an annealing treatment.

FIG. 8 is a graph representing Raman spectroscopy spectra before and after the silicon dioxide layer of Comparative Example 1 undergoes an annealing treatment. FIG. 9 is a graph representing Raman spectroscopy spectra before and after the silicon dioxide layer of Example 1 undergoes an annealing treatment.

In this regard, the annealing treatment was performed at 300° C. for 30 minutes in a vacuum atmosphere.

As shown in FIG. 8, in Comparative Example 1 the intensity of the peaks P3 and P4 and the peak group Pg is sharply reduced by the annealing treatment. This reduces structural defects that are attributed to the ring-shaped structures having a three membered ring or a four or more membered ring. In other words, the silicon dioxide layer of Comparative Example 1 has a lot of structural defects and therefore lacks structural integrity.

On the other hand, as shown in FIG. 9, in Example 1 the intensity of the peaks P3 and P4 and the peak group Pg shows little change despite the annealing treatment. That is to say, the silicon dioxide layer of Example 1 has a reduced number of structural defects and therefore exhibits enhanced structural integrity.

Insertion Loss

With respect to the acoustic wave devices of Example 1 and Comparative Example 1, frequency characteristics of insertion loss as filter characteristics were found from the measurement results of an S parameter. The results are shown in FIG. 10.

Figure 10:
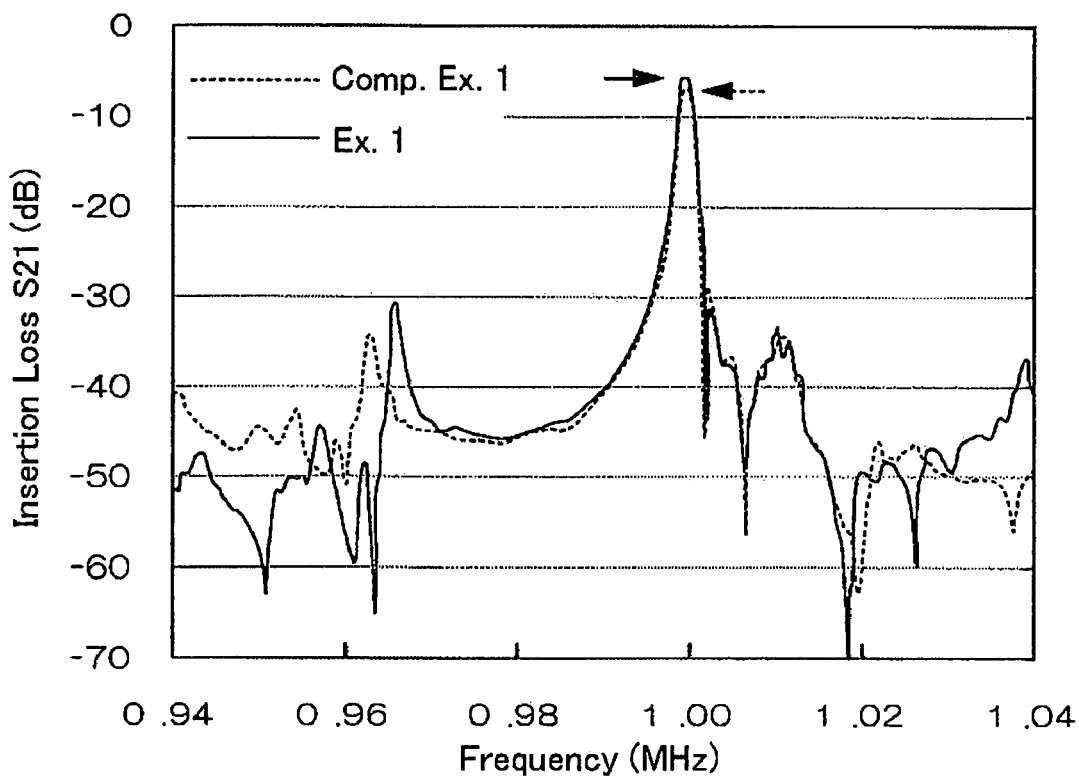
FIG. 10 is a graph representing a frequency dependency of insertion loss of the acoustic wave devices of Comparative Example 1 and Example 1.

FIG. 10 is a graph representing a frequency dependency of insertion loss of the acoustic wave devices of Comparative Example 1 (shown in a dot line) and Example 1 (shown in a solid line).

In this regard, the measurement of an S parameter was conducted by Vector Network Analyzer (product number: HP8753c) manufactured by Hewlett-Packard Company.

As shown in FIG. 10, the insertion loss in a pass band was −6.5 dB in Comparative Example 1 but was sharply increased to −5.3 dB in Example 1. This means that a reflection coefficient and an electromechanical coupling coefficient were increased due to the reduction of structural defects in Example 1 unlike in Comparative Example 1. The performance improvement thus achieved makes it possible to miniaturize devices (e.g., a SAW filter).

Frequency Variation Rate

Next, the acoustic wave devices of Example 1 and Comparative Example 1 were annealed within a vacuum vessel under a pressure of $10^{-8}$ Pa or less at 300° C. for three hours. Thereafter, the acoustic wave devices were bonded to a package with an aluminum wire. Leads were bonded to the package by seam welding in a nitrogen atmosphere. The acoustic wave devices were encapsulated within the package.

Then, an oscillatory frequency of the products thus produced was measured and the products were stored within a constant temperature bath of 85° C. Measurement of an oscillatory frequency was conducted at a predetermined time interval and frequency variation characteristics over time were analyzed. The results are shown in FIG. 11.

Figure 11:
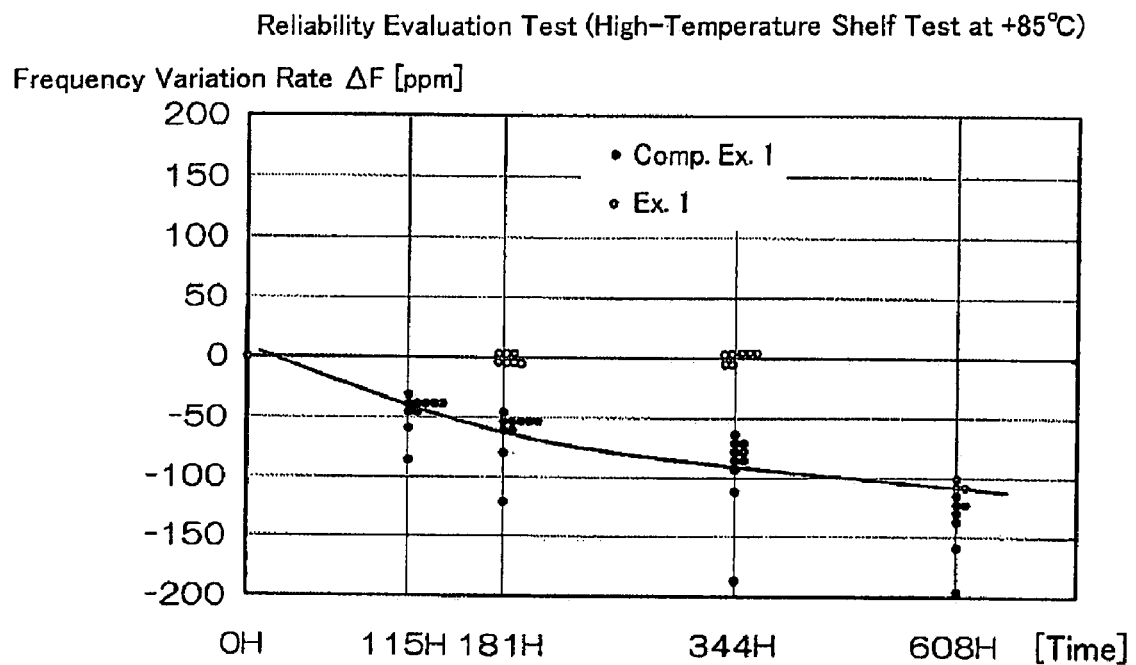
FIG. 11 is a graph representing a time-dependent frequency variation rate in a high-temperature shelf test for the acoustic wave devices of Comparative Example 1 and Example 1.

FIG. 11 is a graph representing a time-dependent frequency variation rate in a high-temperature shelf test for the acoustic wave devices of Comparative Example 1 and Example 1.

As shown in FIG. 11, the oscillatory frequency variation rate ΔF in Comparative Example 1 was −40 ppm after lapse of 100 hours, −80 ppm after lapse of 300 hours and more than −100 ppm after lapse of 600 hours. In contrast, in Example 1, little oscillatory frequency variation was observed even after lapse of 300 hours. That is to say, in the acoustic wave device of Example 1, no oscillatory frequency variation was generated even under the heating conditions noted above.

As described above, device characteristics are improved with the reduction of structural defects in the silicon dioxide layer. Particularly, frequency stability becomes extremely high and little frequency variation occurs over time in a heated state.

Constant Term A in a Cauchy Dispersion Formula

In the foregoing description, the relationship between the Raman spectroscopy spectrum of the silicon dioxide layer and the characteristics of the acoustic wave device has been analyzed in terms of the layer quality (the degree of structural defects). Other examples of a characteristic index reflecting the layer quality of the silicon dioxide layer include an optical constant (a refractive index).

In this context, an optical constant of the silicon dioxide layers was measured and its relationship with the device characteristics was reviewed in respect of the respective Examples and Comparative Examples.

In the meantime, when measuring the optical constant of the silicon dioxide layers, silicon substrates on which a silicon dioxide layer of about 70 nm in thickness was formed by various methods were used as measurement specimens. In this regard, it is to be noted that the silicon dioxide layers of the measurement specimens were formed under the same conditions as those used in Examples 1 and 2 and Comparative Examples 1 to 3, and by performing the same process as in Example 1 except that the oxygen flow rate ratio was changed to 5%.

In other words, measurement specimens in which a silicon dioxide layer was formed by RF magnetron sputtering in the oxygen flow rate ratios of 5%, 34% (Comparative Example 1), 80% (Example 2) and 90% (Example 1), and measurement specimens in which a silicon dioxide layer was formed by ECR sputtering (in a metal mode) in the oxygen flow rate ratio of 16% (Comparative Example 2) and by ECR sputtering (in an oxide mode) in the oxygen flow rate ratio of 18.5% (Comparative Example 3) were prepared.

Then, an optical constant of each of the silicon dioxide layers in these measurement specimens was measured. Investigation was conducted for a literature data of a product layered by typical CVD (Amorphous Silica Material Application Handbook, published in May 1999, editor general Hiroshi Kawazoe, REALIZE) and an optical constant of a thermal oxide film and molten quartz.

Spectroscopic Ellipsometry Device SE-5 manufactured by SOPRA was used in determining the optical constant. Furthermore, the optical constant was found by fitting measured data to an optical dispersion formula.

Figure 12:
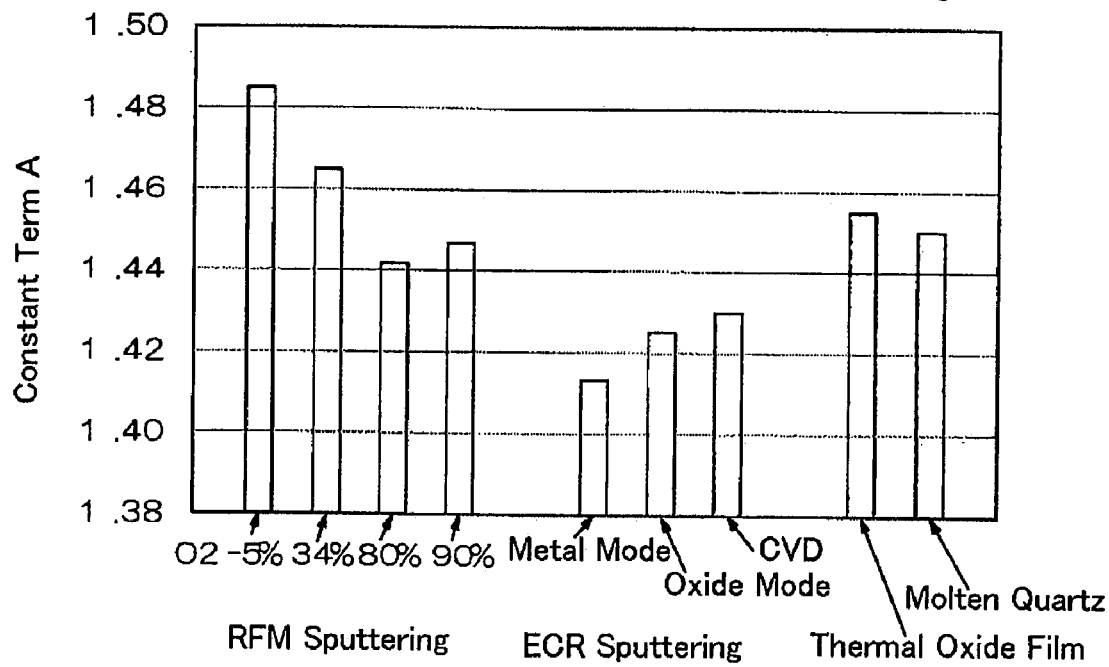
FIG. 12 is a graph representing the optical constant of each of silicon dioxide layers formed by various methods.

The calculation results of the optical constant thus obtained are shown in FIG. 12. The optical constant shown in this figure stands for the constant term A (a term not depending on a wavelength λ) of the Cauchy dispersion formula mentioned earlier.

It is generally known that a thermal oxide film or molten quartz has a reduced number of structural defects and is structurally stable. The results of comparison reveal that all the constant terms A in Comparative Examples 1 to 3 differ from those of the thermal oxide film and the molten quartz but the constant terms A in Examples 1 and 2 are extremely similar to those of the thermal oxide film and the molten quartz.

Figure 13:
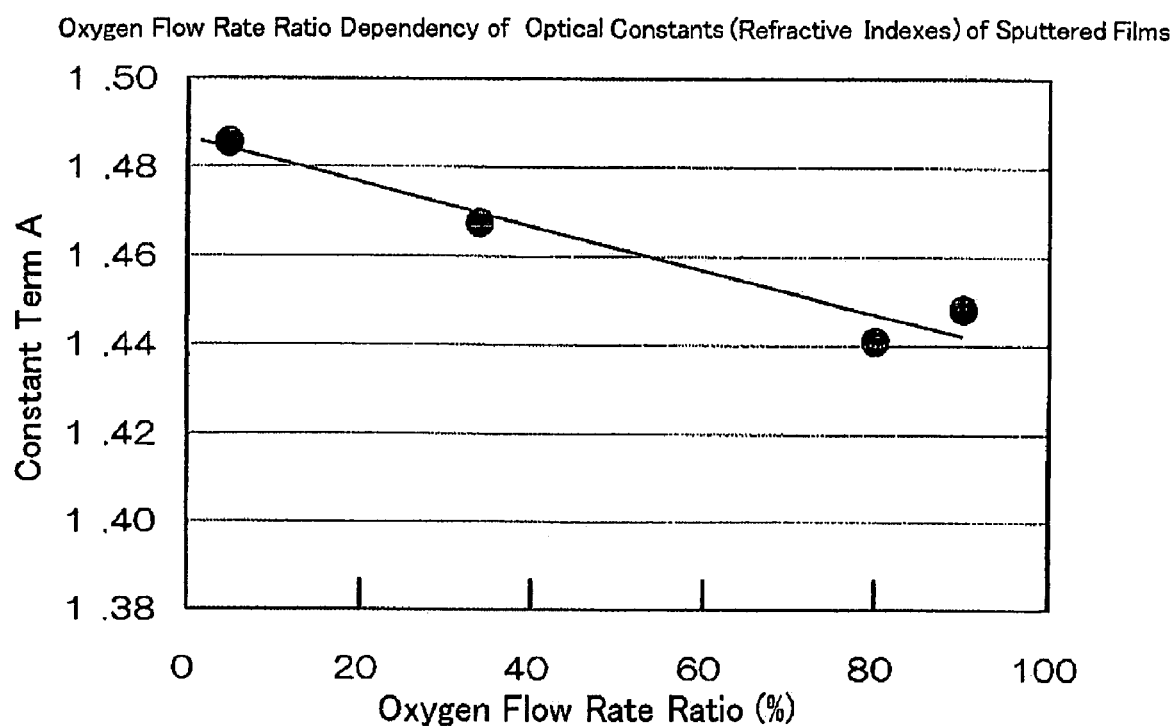
FIG. 13 is a graph representing an oxygen flow rate ratio dependency of optical constant of the silicon dioxide layer.

Further, FIG. 13 shows an oxygen flow rate ratio dependency of the constant term A in Comparative Example 1 and Examples 1 and 2 in which a silicon dioxide layer was formed by an RF magnetron sputtering. As shown in FIG. 13, the constant term A is decreased with an increase of the oxygen flow rate ratio at the time of sputtering.

Moreover, if the constant term A of the Cauchy dispersion formula is in a range of 1.44 to 1.46, there is provided an effect that the acoustic wave device enjoys improvement in its characteristics. This is because the above-noted range conforms to the extremely stable optical characteristics of silicon dioxide present in the thermal oxide film or the molten quartz.

What is claimed is:

1. An acoustic wave device, comprising:
   a piezoelectric body layer having piezoelectricity and one surface;
   a pair of electrodes for, when electrified, inducing acoustic vibration in the piezoelectric body layer, the electrodes arranged on the one surface of the piezoelectric body layer; and
   a silicon dioxide layer provided in contact with the piezoelectric body layer and/or the electrodes, the silicon dioxide layer composed of silicon dioxide as its major component,
   wherein the silicon dioxide layer is formed by performing sputtering with a silicon dioxide target in an atmosphere of an oxygen flow rate ratio of 60% or more.

2. The acoustic wave device as claimed in claim 1, wherein in a spectrum obtained by analyzing the silicon dioxide layer with a Raman spectroscopy, when the intensity of a peak existing in a wave number region of 800 to 850 cm$^{-1}$ is defined by Ps and the intensity of a peak existing in a wave number region of 475 to 515 cm$^{-1}$ is defined by P4, the peak intensity ratio P4/Ps is equal to or smaller than 1.2.

3. The acoustic wave device as claimed in claim 1, wherein in a spectrum obtained by analyzing the silicon dioxide layer with a Raman spectroscopy, when the intensity of a peak existing in a wave number region of 800 to 850 cm$^{-1}$ is defined by Ps and the intensity of a peak existing in a wave number region of 600 to 620 cm$^{-1}$ is defined by P3, the peak intensity ratio P3/Ps is equal to or smaller than 1.0.

4. The acoustic wave device as claimed in claim 1, wherein in a spectrum obtained by analyzing the silicon dioxide layer with a Raman spectroscopy, when the integral value of the intensity in a wave number region of 250 to 510 cm$^{-1}$ is defined by I1 and the integral value of the intensity in a wave number region of 800 to 840 cm$^{-1}$ is defined by I2, the intensity integral value ratio I1/I2 is equal to or smaller than 50.

5. The acoustic wave device as claimed in claim 1, wherein the constant term A of a Cauchy dispersion formula represented by the following equation (I) is 1.44 to 1.46:

$$n^2 = A + B/\lambda^2 \quad (I)$$

where the $\lambda$ is a wavelength of the light, the n is a refractive index of the silicon dioxide layer to the light having a wavelength of $\lambda$, and each of the A and B is a constant.

6. The acoustic wave device as claimed in claim 1, wherein each of the electrodes is a comb-shaped electrode, and when electrified, a surface acoustic wave is induced in the piezoelectric body layer as the acoustic vibration.

7. The acoustic wave device as claimed in claim 6, further comprises a substrate for supporting the piezoelectric body layer.

8. The acoustic wave device as claimed in claim 7, wherein the piezoelectric body layer is provided on the substrate via a hard layer formed of diamond or diamond-like carbon.

* * * * *